(12) United States Patent
Nakamura et al.

(10) Patent No.: US 10,228,724 B2
(45) Date of Patent: *Mar. 12, 2019

(54) PORTABLE INFORMATION DEVICE

(71) Applicant: LENOVO (SINGAPORE) PTE. LTD., Singapore (SG)

(72) Inventors: Fusanobu Nakamura, Kanagawa (JP); Atsushi Nagashima, Kanagawa (JP)

(73) Assignee: LENOVO (SINGAPORE) PTD LTE, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/654,242

(22) Filed: Jul. 19, 2017

(65) Prior Publication Data

US 2018/0024590 A1  Jan. 25, 2018

(30) Foreign Application Priority Data

Jul. 19, 2016 (JP) .................. 2016-141465

(51) Int. Cl.
| | | |
|---|---|---|
| *G02F 1/1333* | (2006.01) | |
| *G06F 1/16* | (2006.01) | |
| *G06F 3/041* | (2006.01) | |
| *H05K 5/03* | (2006.01) | |
| *A45C 13/00* | (2006.01) | |
| *A45C 11/00* | (2006.01) | |

(52) U.S. Cl.
CPC .......... *G06F 1/1626* (2013.01); *G06F 1/1656* (2013.01); *G06F 1/1677* (2013.01); *G06F 3/041* (2013.01); *H05K 5/03* (2013.01); *A45C 13/005* (2013.01); *A45C 2011/002* (2013.01); *A45C 2011/003* (2013.01); *A45C 2200/15* (2013.01); *G06F 2200/1634* (2013.01)

(58) Field of Classification Search
None
See application file for complete search history.

(56) References Cited

U.S. PATENT DOCUMENTS

| | | |
|---|---|---|
| 2012/0044620 A1 | 2/2012 | Song et al. |
| 2015/0241925 A1 | 8/2015 | Seo et al. |
| 2016/0070306 A1 | 3/2016 | Shin et al. |

FOREIGN PATENT DOCUMENTS

JP  2014-216025 A  11/2014

*Primary Examiner* — Richard H Kim
(74) *Attorney, Agent, or Firm* — Antony P. Ng; Russell Ng PLLC

(57) ABSTRACT

A portable information device is provided. The portable information device includes a first chassis and a second chassis, a display, a back part and a movable back plate. The display, which is configured to be foldable in half, is disposed over inner faces of the first and second chassis. The back part, includes a movable hinge configured to join the first and second chassis rotatably. When the first and second chassis are folded towards each other, the movable hinge moves on the inner faces of the chassis in a direction from open ends of the chassis to the back part that is located on an opposite side of the open ends. The movable back plate configured to support a rear face of the display at a part corresponding to the back part. When the first and second chassis are folded towards each other, the movable back plate moves in a direction from the open ends to the back part together with the movable hinge.

16 Claims, 14 Drawing Sheets

FIG. 10

PORTABLE INFORMATION DEVICE

PRIORITY CLAIM

The present application claims benefit of priority under 35 U.S.C. §§ 120, 365 to the previously filed Japanese Patent Application No. JP2016-141465 with a priority date of Jul. 19, 2016, which is incorporated by reference herein.

TECHNICAL FIELD

The present invention relates to portable information devices in general, and in particular to a portable information device having a display that can be folded inside of a foldable chassis.

BACKGROUND

A portable information device, such as a tablet computer or a smartphone, typically includes a touch-screen liquid crystal display but not a physical keyboard. The display of the portable information device of this type is desirably larger in size for use, but a smaller display is desired when carrying it. To this end, a portable information device including a flexible display, such as an organic Electro Luminescence (EL), is designed. With this type of portable information device, not only a chassis but, also the display can be folded.

In the configuration including a foldable display attached to the inner face of a chassis that can be folded in half like a book, the display on the inside will have a different perimeter from that of the chassis on the outside when they are folded. In order to accommodate this difference in perimeter, the display and the chassis are not fixed in their positions, for example, so that the display can be slid relative to the chassis when folding them. The open ends of the display then will extend out from the open ends of the chassis, and the appearance of the device deteriorates. This leads to another problem that a gap is required for sliding between the display and the chassis, and foreign matters or water may enter the gap when the display is opened. Frequent sliding may lead to another concern of a failure or malfunction of the display.

Consequently, it would be preferable to provide a portable information device having a foldable display that can maintain the quality of appearance without causing a failure or malfunction.

SUMMARY

In accordance with an embodiment of the present disclosure, a portable information device includes a first chassis and a second chassis, a display, a back part and a movable back plate. The display, which is configured to be foldable in half, is disposed over inner faces of the first and second chassis. The back part includes a movable hinge configured to join the first and second chassis rotatably. When the first and second chassis are folded towards each other, the movable hinge moves on the inner faces of the chassis in a direction from open ends of the chassis to the back part that is located on an opposite side of the open ends. The movable back plate configured to support a rear face of the display at a part corresponding, to the back part. When the first and second chassis are folded towards each other, the movable back plate moves in a direction from the open ends to the back part together with the movable hinge.

With the above-mentioned configuration, when the first and second chassis are folded towards each other, the back part moves in the direction away from the display, and so this can accommodate the movement of the display at the folding part so as not to extend out. As a result, the display can be folded smoothly, and the display can have a folded shape in half without deformation inside of the closed chassis, and therefore breakage or failure of the display can be avoided. The movable back part can avoid extending out of both ends of the display from the open ends of the chassis and can maintain a good appearance while avoiding foreign matters or water from entering the gap between the display and the chassis.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 10 is a perspective view of a pushup mechanism;

DETAILED DESCRIPTION

1. Overall Configuration of a Portable Information Device

Figure 1:
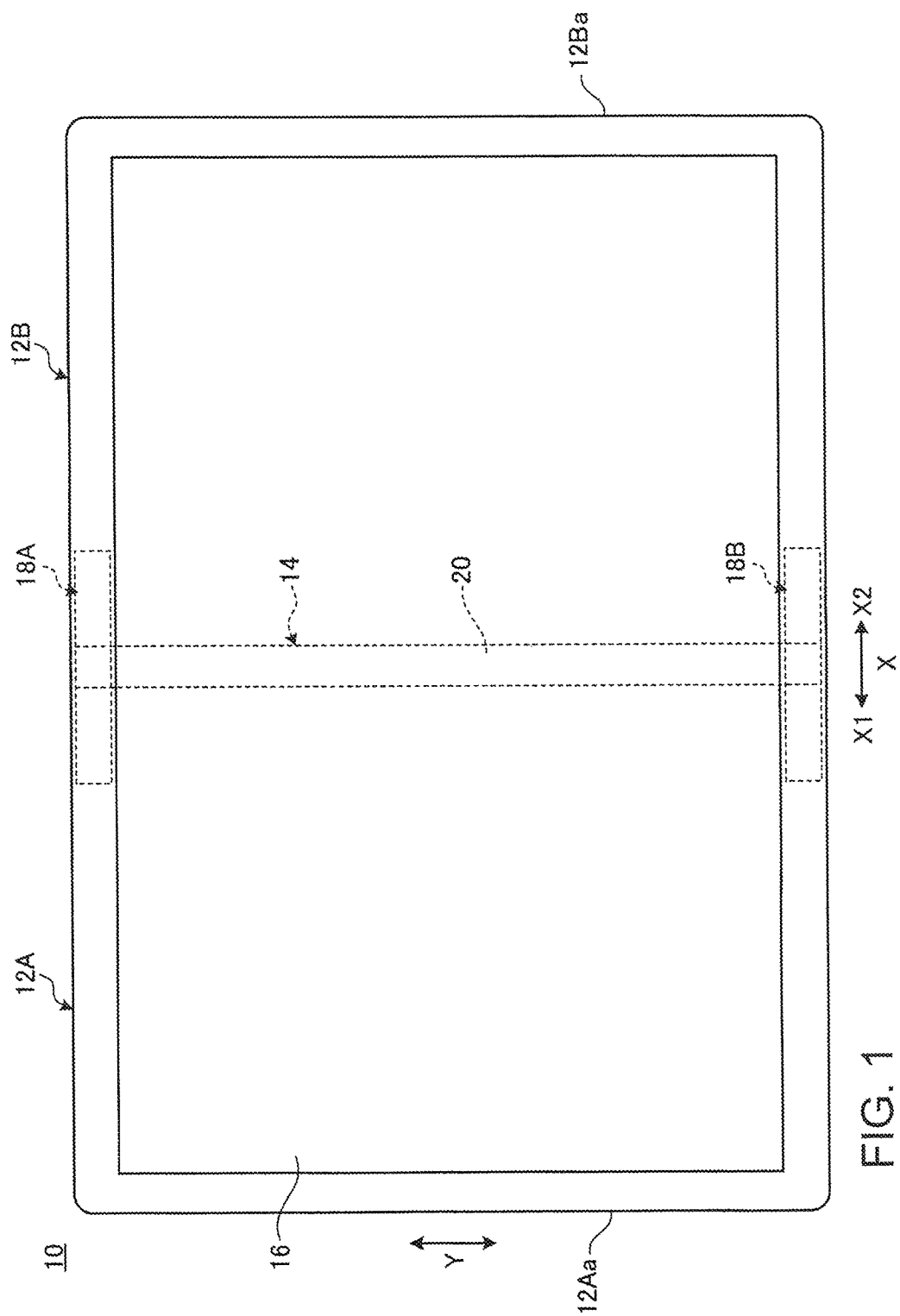
FIG. 1 is a plan view of a portable information device according to one embodiment of the present invention.
Figure 2:
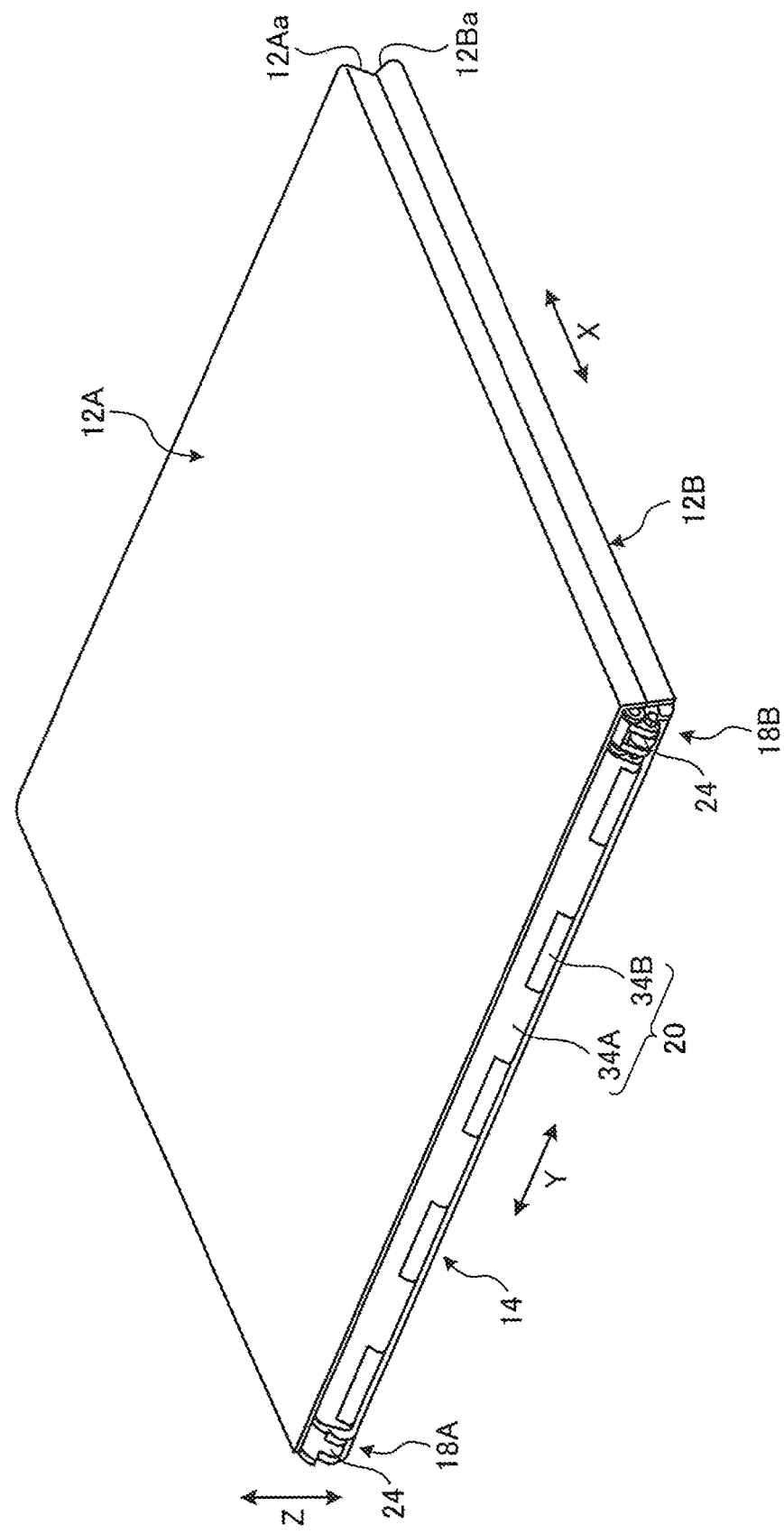
FIG. 2 is a perspective view of the portable information device from FIG. 1 when it is closed.

FIG. 1 is a plan view of a portable information device 10 according to one embodiment of the present invention, and this drawing shows the portable information device when a pair of chassis 12A and 12B is opened. FIG. 2 is a perspective view of the portable information device 10 in FIG. 1 when it is closed.

As shown in FIGS. 1 and 2, the portable information device 10 includes the pair of the chassis 12A and 12B, a back part 14, and a display 16. The present embodiment illustrates a tablet PC as the portable information device 10, and the portable information device 10 may be a mobile phone, a smartphone, an electronic organizer or the like.

Each chassis 12A, 12B is a plate-like member having lateral walls on the three sides other than the back part 14. Each chassis 12A, 12B supports the display 16 on their inner faces. The chassis 12A and 12B are joined via the back part 14 so that they can be folded in half. The chassis 12A and 12B have a hinge at the back part 14, and the side opposite to the back part 14 is an open end 12Aa or 12Ba of the chassis. Between the inner faces of the chassis 12A and 12B and the rear face of the display 16, various electronic parts, such as an arithmetic device or a memory, are stored.

The back part 14 serves as a folding part when the pair of the chassis 12A and 12B is folded in half. The back part 14 covers and supports the rear face of the display 16 at the folding part when the pair of the chassis 12A and 12B is folded in half with the display 16 inside. The back part 14 includes a pair of movable hinges 18A and 18B that are disposed on both ends, and a movable back plate 20 that extends between the pair of movable hinges 18A and 18B.

The display 16 is a touch-screen liquid crystal display, for example. The display 16 can be folded together with the chassis 12A and 12B when the chassis are folded, and is a flexible display having a flexible paper structure. The display 16 has both ends that are fixed in the position at positions close to the open ends 12Aa and 12Ba of the chassis 12A and 12B, and is opened and closed when the chassis 12A and 12B are opened and closed.

As shown in FIGS. 1 and 2, the following refers to the direction from the back part 14 of the portable information device 10 to the open ends 12Aa and 12Ba as X direction, the direction along the longitudinal direction of the back part 14 as Y direction, and the thickness direction of the chassis 12A, 12B as Z direction. For the X direction, the direction from the back part 14 to one of the open ends 12Aa may be referred to as X1 direction, and the direction from the back part 14 to the other open end 12Ba may be referred to as X2 direction. When the chassis 12A and 12B are closed as in FIG. 2, the Z direction refers to the overlapping direction of the two chassis 12A and 12B. When the chassis 12A and 12B are opened, the Z direction refers to the thickness direction of each chassis 12A, 12B.

2. Back Part

Figure 3:
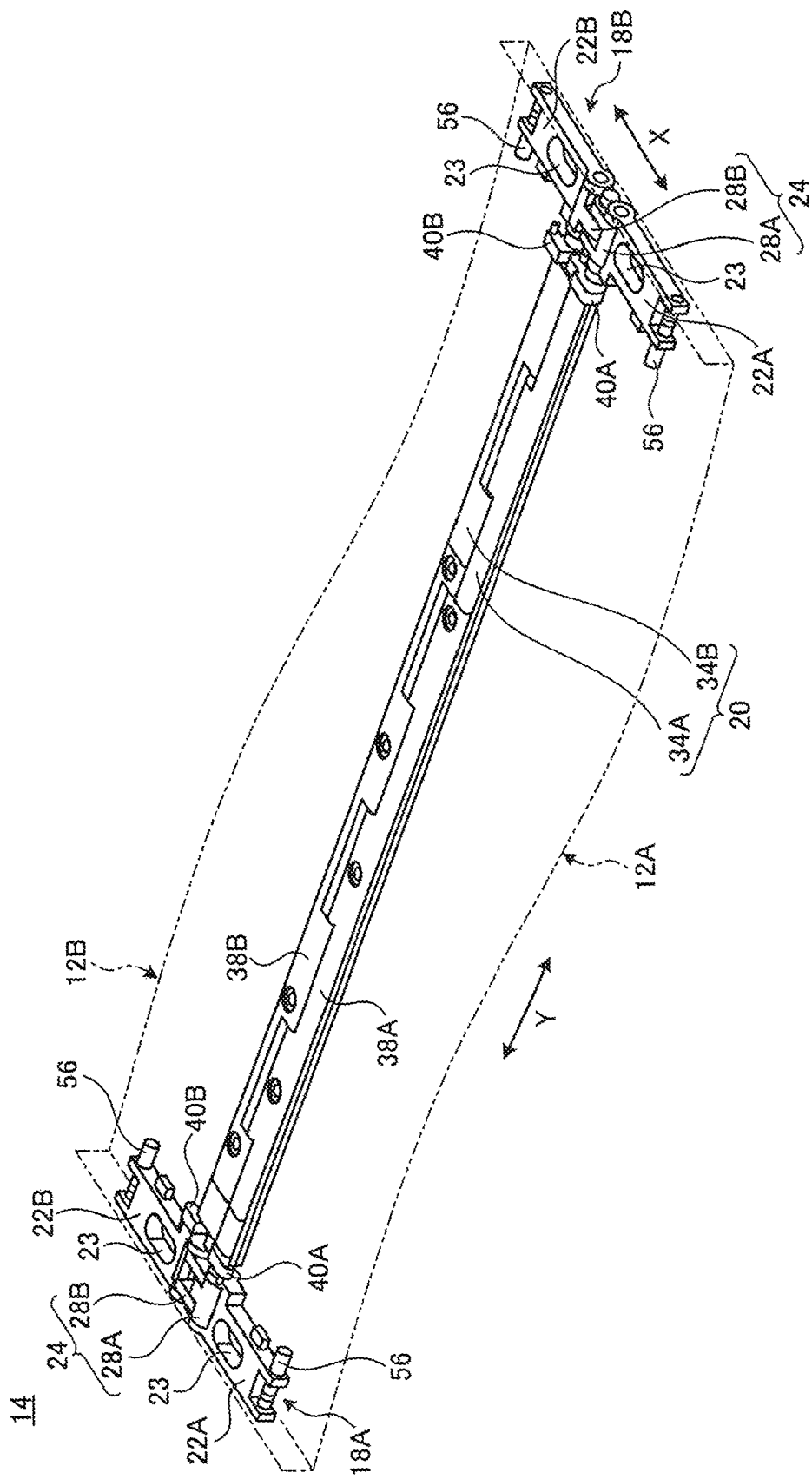
FIG. 3 is a perspective view of a major part of the back part.
Figure 4:
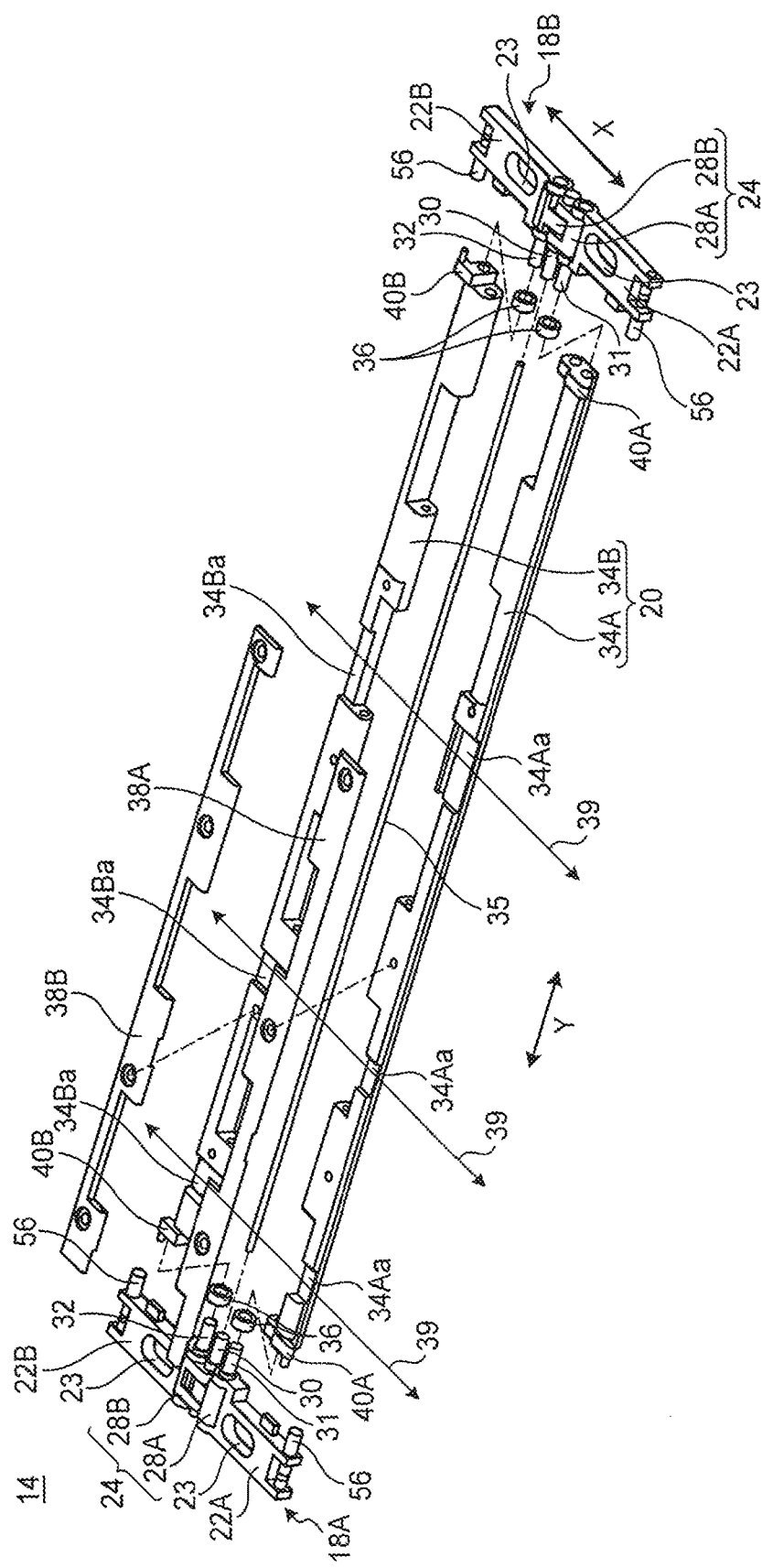
FIG. 4 is an exploded perspective view of the back part of FIG. 3.

FIG. 3 is a perspective view of a major part of the back part 14. FIG. 4 is an exploded perspective view of the back part 14 of FIG. 3. FIGS. 5 to 8 are enlarged perspective views showing the motion around one of the movable hinges 18A, showing the chassis 12A and 12B at 180 degrees, 135 degrees, 90 degrees and 0 degree, respectively. FIGS. 9A to 9D are enlarged cross-sectional views showing the motion of the movable back plate 20, showing the chassis 12A and 12B at 180 degrees, 135 degrees, 90 degrees and 0 degree, respectively.

2.1 Configuration of Movable Hinges

The following describes the configuration of the movable hinges 18A and 18B. The following describes one of the movable hinges 18A as an example. Since the other movable hinge 18B has the same configuration other than that it has a line-symmetric configuration of the one movable hinge 18A with respect to the center of the back part 14 in the longitudinal direction, its detailed descriptions are omitted.

Figure 5:
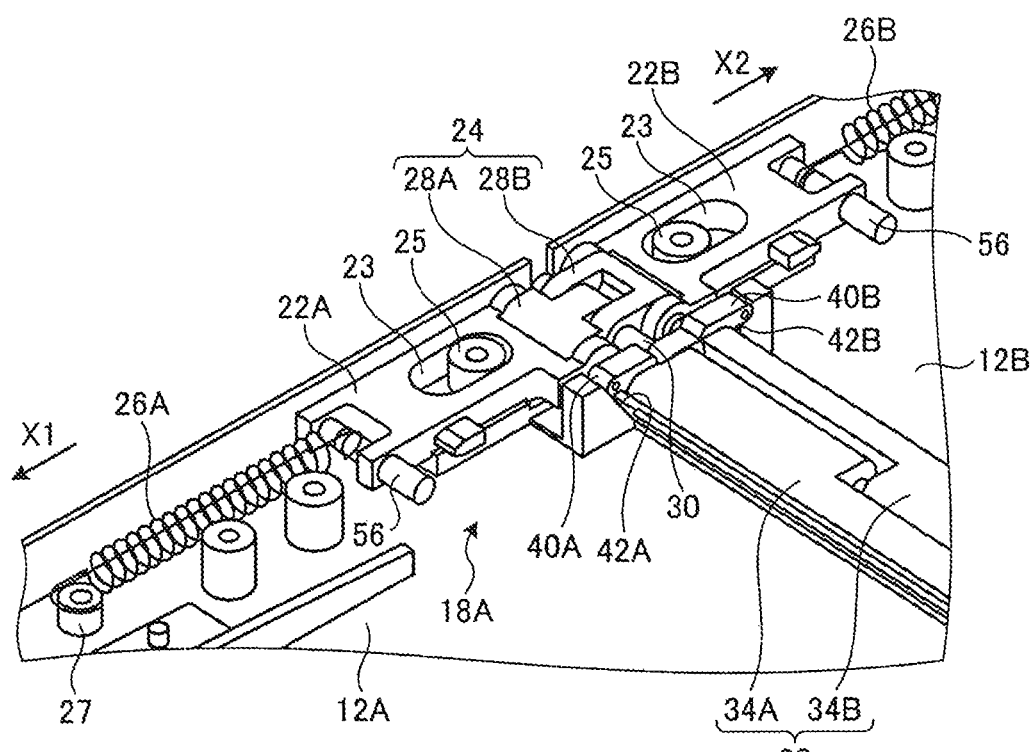
FIG. 5 is an enlarged perspective view showing a part around one of the movable hinges when the chassis are at 180 degrees.

As shown in FIGS. 3 and 4, the movable hinge 18A (18B) includes a first slide member 22A, a second slide member 22B and a hinge shaft 24. The first slide member 22A is supported on the inner face of one of the chassis 12A to be slidable in the X direction from the back part 14 to the open end 12Aa. As shown in FIG. 5, the first slide member 22A has a slot 23 along the slide direction, and a guide pin 25 that protrudes from the inner face of the chassis 12A is slidably inserted into the slot 23. The first slide member 22A slides in the X direction under the guiding action of the guide pin 25.

As shown in FIG. 5, the first slide member 22A has one end that is rotatably joined with the hinge shaft 24. The first slide member 22A has the other end attached to a first elastic member 26A. The first elastic member 26A is a coil spring, for example. The first elastic member 26A has one end attached to the first slide member 22A and the other end attached to a pin 27 protruding from the inner face of the chassis 12A. The first elastic member 26A always biases the first slide member 22A in the direction from the back part 14 to the open end 12Aa (X1 direction) on the inner face of the chassis 12A.

The second slide member 22B is supported on the inner face of the other chassis 12B to be slidable from the back part 14 to the open end 12Ba. As shown in FIG. 5, the second slide member 22B has a slot 23 along the slide direction, and a guide pin 25 that protrudes from the inner face of the chassis 12B is slidably inserted into the slot 23. The second slide member 22B slides in the X direction under the guiding action of the guide pin 25.

As shown in FIG. 5, the second slide member 22B has one end that is rotatably joined with the hinge shaft 24. The second slide member 22B has the other end attached to a second elastic member 26B. The second elastic member 26B is a coil spring, for example. The second elastic member 26B has one end attached to the second slide member 22B and the other end attached to a pin 27 (see FIG. 13) protruding from the inner face of the chassis 12B. The second elastic member 26B always biases the second slide member 22B in the direction from the back part 14 to the open end 12Ba (X2 direction) on the inner face of the chassis 12B.

The hinge shaft 24 rotatably joins the first slide member 22A and the second slide member 22B. The hinge shaft 24 includes a first rotary member 28A and a second rotary member 28B that are joined mutually rotatably. As shown in FIG. 4, the first rotary member 28A has one end that joins rotatably with the second rotary member 28B via a shaft pin 30, and has the other end that joins rotatably with the first slide member 22A via a shaft pin 31. The second rotary member 28B has one end that joins rotatably with the first rotary member 28A via the shaft pin 30, and has the other end that joins rotatably with the second slide member 22B via a shaft pin 32. The hinge shaft 24 rotatably joins the first rotary member 28A and the second rotary member 28B around the center shaft pin 30 as the rotary axis from 0 degree (see FIG. 8) to 180 degrees (see FIG. 5).

2.2 Configuration of Movable Back Plate

As shown in FIGS. 3 and 4, the movable back plate 20 includes a first back plate 34A and a second back plate 34B. The first back plate 34A and the second back plate 34B have mutually engaging concavo-convex shapes, and are joined so that the concaves and convexities are opposed. The first back plate 34A and the second back plate 34B are mutually rotatably joined with a long shaft bar 35 that penetrates through the center of the engaging concavo-convex shapes in the Y direction. The shaft bar 35 is fitted coaxially with and not-rotatably into the shaft pins 30 at the center of the hinge shafts 24 of the pair of movable hinges 18A and 18B.

The first back plate 34A has one end fitted coaxially with and not-rotatably into the shaft pin 31 of one of the movable hinges 18A via a washer 36, and has the other end fitted coaxially with and not-rotatably into the shaft pin 31 of the other movable hinges 18B via a washer 36. With this configuration, the first back plate 34A is fixed so that it can rotate integrally with the first rotary member 28A, and is rotatably joined with the first slide member 22A.

The second back plate 34B has one end fitted coaxially with and not-rotatably into the shaft pin 32 of one of the movable hinges 18A via a washer 36, and a has the other end fitted coaxially with and not-rotatably into the shaft pin 32 of the other movable hinges 18B via a washer 36. With this configuration, the second back plate 34B is fixed so that it can rotate integrally with the second rotary member 28B, and is rotatably joined with the second slide member 22B.

As shown in FIG. 4, the first back plate 34A and the second back plate 34B have a plurality of concavities 34Aa and 34Ba along the longitudinal directions at their mutually opposed parts. Each concavity 34Aa of the first back plate 34A is a thin part where the thickness of the first back plate 34A is reduced, and a cover member 38A is disposed at this thin part. Each concavity 34Ba of the second back plate 34B is a thin part where the thickness of the second back plate 34B is reduced, and a cover member 38B is disposed at this thin part. When the cover members 38A and 38B close the concavities 34Aa and 34Ba, the concavities 34Aa and 34Ba define a through hole. This through hole is to place wiring 39 between the chassis 12A and 12B.

As shown in FIGS. 3 to 5, the first back plate 34A includes a sliding protrusion 40A at the ends close to the movable hinge 18A and 18B, and each sliding protrusion protrudes toward the direction opposite to the second back plate 34B. The second back plate 34B includes a sliding protrusion 40B at the ends close to the movable hinge 18A and 18B, and each sliding protrusion protrudes toward the direction opposite to the first back plate 34A. Each of the sliding protrusions 40A and 40B has a leading end that is an arc-like curved face.

The sliding protrusion 40A of the first back plate 34A is disposed slidably on a first inclined face 42A on the inner face of one of the chassis 12A. The first inclined face 42A is a substantially triangle-shaped protrusion on the inner face of the chassis 12A, and is opposed to the first back plate 34A. The first inclined face 42A inclines toward the inner face of the chassis 12A in the direction from the open end 12Aa to the back part 14. The sliding protrusion 40B of the second back plate 34B is disposed slidably on a second inclined face 42B on the inner face of the other chassis 12B. The second inclined face 42B is a substantially triangle-shaped protrusion on the inner face of the chassis 12B, and is opposed to the second back plate 34B. The second inclined face 42B inclines toward the inner face of the chassis 12B in the direction from the open end 12Ba to the back part 14.

Figure 9A:
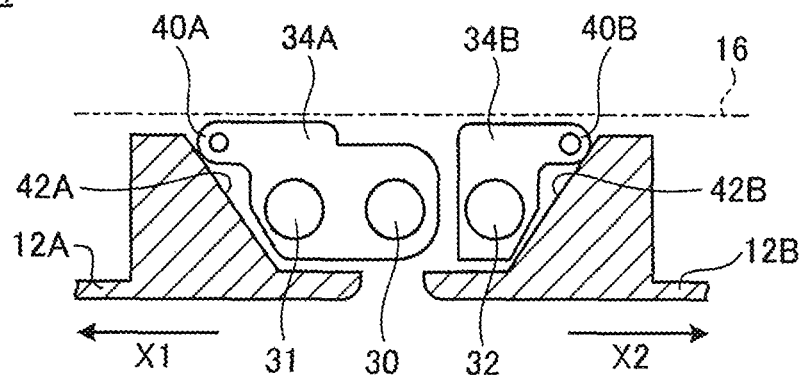
FIG. 9A is an enlarged cross-sectional view showing the motion of a movable back plate when the chassis are at 180 degrees.
Figure 9B:
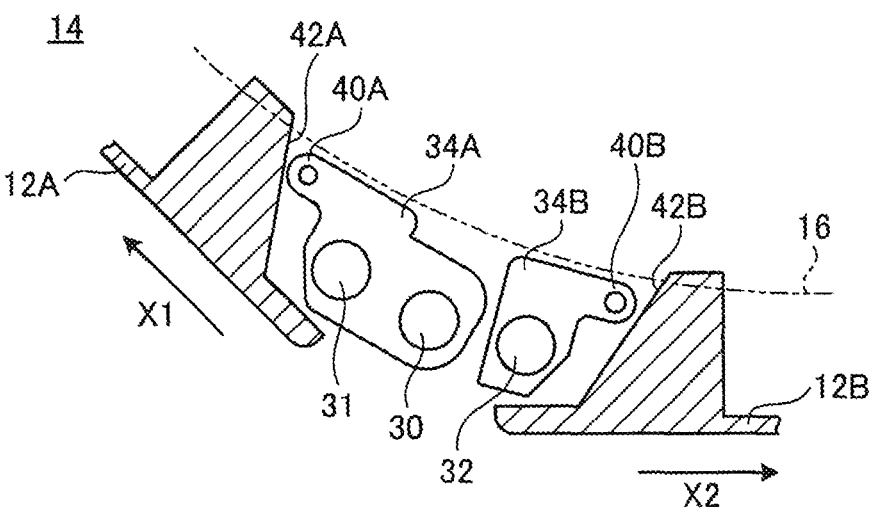
FIG. 9B is an enlarged cross-sectional view showing the motion of the movable back plate when the chassis are at 135 degrees.
Figure 9C:
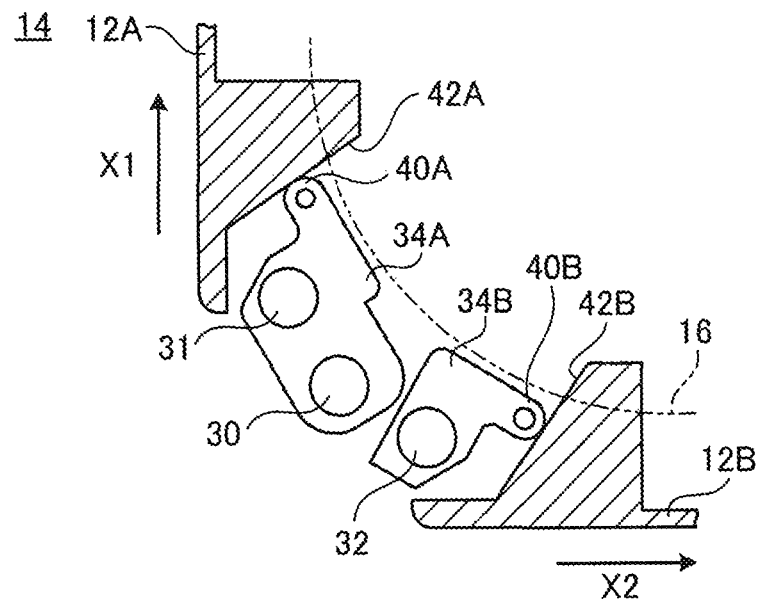
FIG. 9C is an enlarged cross-sectional view showing the motion of the movable back plate when the chassis are at 90 degrees.
Figure 9D:
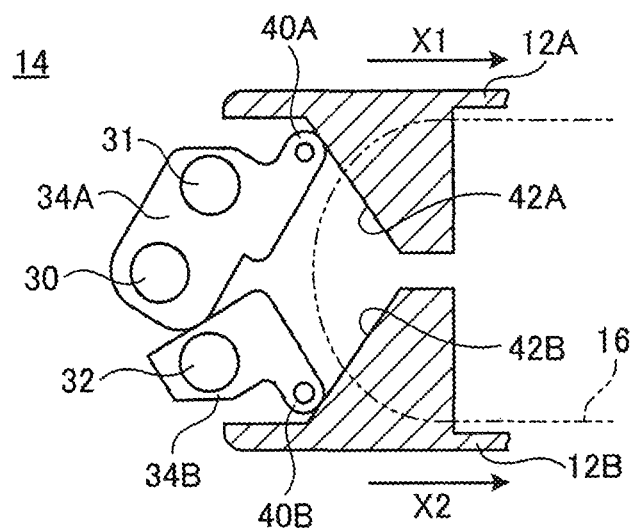
FIG. 9D is an enlarged cross-sectional view showing the motion of the movable back plate when the chassis are at 0 degree.

In this way, these inclined faces 42A and 42B incline from the center between the chassis 12A and 12B to the outside in the direction from the open ends 12Aa and 12Ba to the back part 14 when the pair of the chassis 12A and 12B are folded in half (FIG. 9D).

2.3 Motion and Action of Back Part

The following describes the motion and the action of the movable hinges 18A and 18B and the movable back plate 20 of the back part 14. When the chassis 12A and 12B are opened at 180 degrees as shown in FIG. 1, each movable hinge 18A, 18B has an arrangement such that the first slide member 22A and the second slide member 22B sandwiching the hinge shaft 24 are aligned on a plane (see FIG. 5). In this state, the first slide member 22A is slid to the position closest to the open end 12Aa because of the biasing force of the first elastic member 26A (X1 direction). The second slide member 22B is slid to the position closest to the open end 12Ba because of the biasing force of the second elastic member 26B (X2 direction). As a result, as shown in FIG. 9A, the sliding protrusion 40A of the first back plate 34A is disposed at the upper end position of the first inclined face 42A, and the sliding protrusion 40B of the second back plate 34B is disposed at the upper end position of the second inclined face 42B.

Therefore, the movable hinges 18A and 18B and the movable back plate 20 lie on the inner faces of the chassis 12A and 12B that define a substantially one plate. This allows the rear face of the display 16 at a part corresponding to the back part 14 to be reliably and stably supported by the movable hinges 18A and 18B and the movable back plate 20. This enables stable touch operation and inputting with a pen also at a part of the display 16 corresponding to the back part 14.

Next, when the chassis 12A and 12B opening at 180 degrees are closed to 0 degree, the chassis 12A and 12B are mutually closed about the back part 14 as the rotary center. Then, the first inclined face 42A and the second inclined face 42B on the inner faces of the mutually closing chassis 12A and 12B also move in the closing direction. The sliding protrusion 40A of the first back plate 34A slides on the first inclined face 42A, and the sliding protrusion 40B of the second back plate 34B slides on the second inclined face 42B. Along with this, the first back plate 34A and the second back plate 34B rotate in the mutually closing direction about the shaft pin 30 (shaft bar 35) as the rotary center. As a result, while the first back plate 34A and the second back plate 34B of the movable back plate 20 rotate in the closing direction, the movable back plate 20 moves in the direction from the open ends 12Aa and 12Ba to the back part 14 (the direction opposite to the X1 direction and the X2 direction) (see FIGS. 9A to 9D).

At the same time, the first rotary member 28A and the second rotary member 28B of the hinge shaft 24 of each of the movable hinges 18A and 18B also rotate in the closing direction integrally with the first back plate 34A and the second back plate 34B about the shaft pins 30 as the rotary center. At this time, each hinge shaft 24 moves in the direction from the open ends 12Aa and 12Ba to the back part 14. The first slide member 22A and the second slide member 22B slide in the direction from the open ends 12Aa and 12Ba to the back part 14 on the inner faces of the chassis 12A and 12B against the biasing force of the first elastic member 26A and the second elastic member 26B (see FIGS. 5 to 8).

In this way, when the chassis 12A and 12B are closed, the sliding protrusions 40A and 40B of the back plates 34A and 34B slide on the inclined faces 42A and 42B. As a result, the back part 14 as a whole (the movable back plate 20 and the movable hinges 18A, 18B) moves in the direction away from the open ends 12Aa and 12Ba against the biasing force of the elastic members 26A and 26B.

Figure 6:
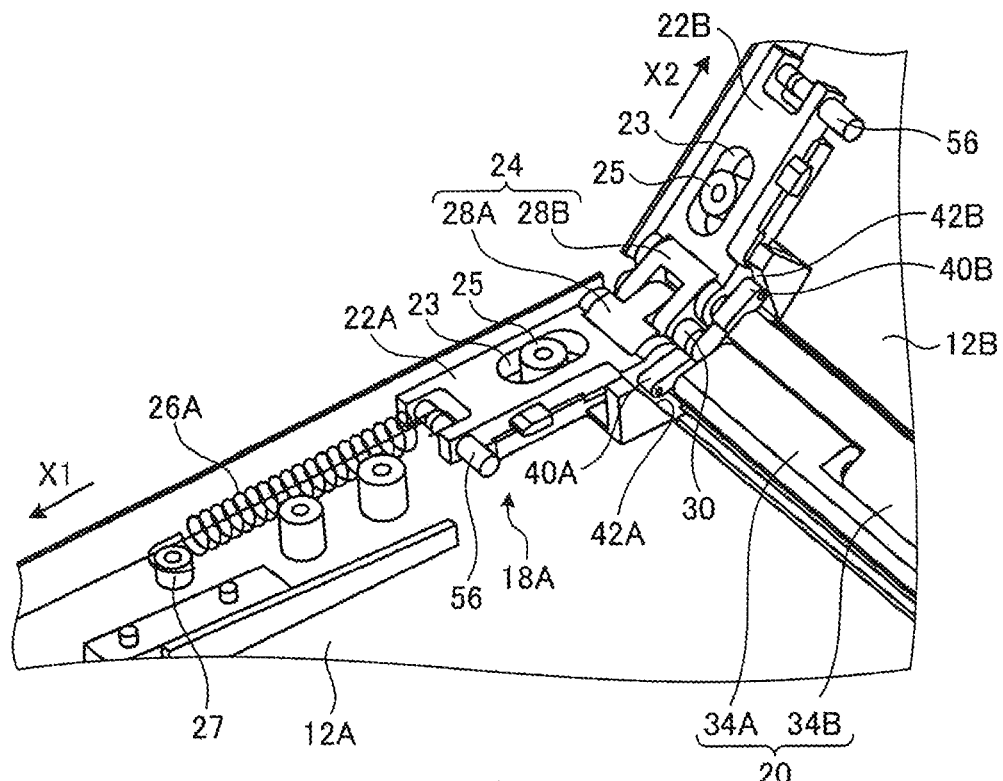
FIG. 6 is a perspective view showing a part around the movable hinge of FIG. 5 when the chassis are at 135 degrees.
Figure 7:
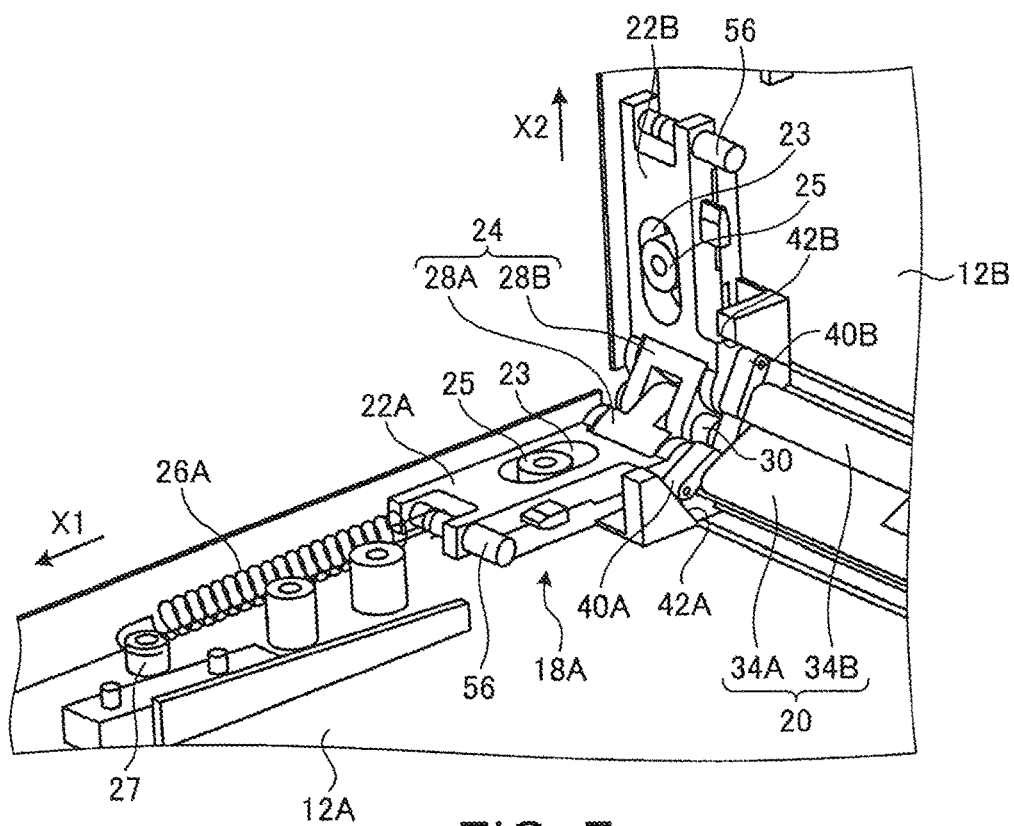
FIG. 7 is a perspective view showing a part around the movable hinge of FIG. 6 when the chassis are at 90 degrees.
Figure 8:
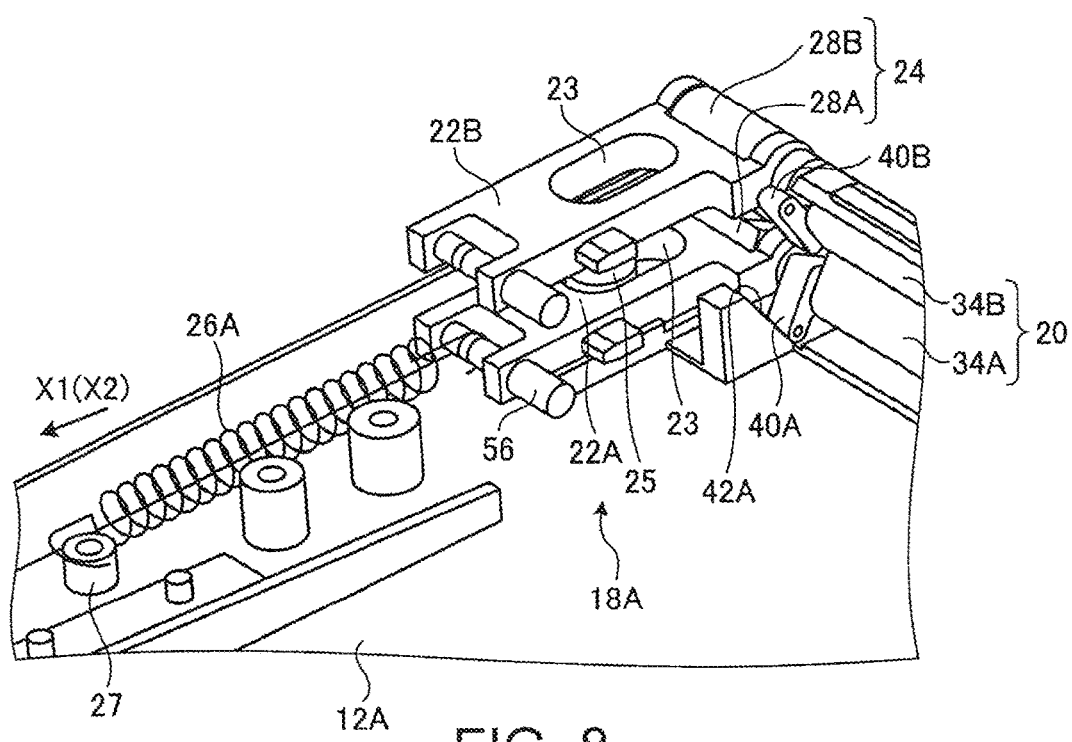
FIG. 8 is a perspective view showing a part around the movable hinge of FIG. 7 when the chassis are at 0 degree.

For instance, when the chassis 12A and 12B are at 135 degrees, the back part 14 moves slightly in the direction away from the open ends 12Aa and 12Ba along the inclined faces 42A and 42B as shown in FIGS. 6 and 9B. When the chassis 12A and 12B are at 90 degrees, the back part 14 moves further in the direction away from the open ends 12Aa and 12Ba along the inclined faces 42A and 42B as shown in FIGS. 7 and 9C. Finally when the chassis 12A and 12B are at 0 degree, the back part 14 moves farthest from the open ends 12Aa and 12Ba along the inclined faces 42A and 42B as shown in FIGS. 8 and 9D. FIGS. 6 to 8 omit the second elastic member 26B.

When the chassis 12A and 12B closed at 0 degree are opened to 180 degrees, the reversed motion occurs. When the chassis 12A and 12B are opened, the sliding protrusions 40A and 40B of the back plates 34A and 34B slide on the inclined faces 42A and 42B. As a result, the back part 14 as a whole (the movable back plate 20 and the movable hinges 18A, 18B) moves in the direction closer to the open ends 12Aa and 12Ba due to the biasing force of the elastic members 26A and 26B.

In the portable information device 10 according to the present embodiment, both ends of the display 16 are fixed near the open ends 12Aa and 12Ba as stated above. This means that, when the opened chassis 12A and 12B are closed, a difference in perimeter is generated between the display 16 on the inside and the chassis 12A and 12B on the outside. As a result, the folding part of the display 16 at a part corresponding to the back part 14 is deformed so as to extend out and protrude from the back part 14. In that case, the display 16 cannot be folded smoothly. Then, excessive load is applied to the display 16 inside of the closed chassis 12A and 12B, and the display is deformed in an unintended fashion, and so breakage or failure may occur in the display.

In this respect, the back part 14 of this portable information device 10 includes the movable hinges 18A and 18B and the movable back plate 20. The movable hinges 18A and 18B join the chassis 12A and 12B rotatably, and when the opened chassis 12A and 12B are folded in half, the movable hinges move from the open ends 12Aa and 12Ba to the back part 14 on the inner faces of the chassis 12A and 12B. The movable back plate 20 supports the rear face of the display 16 at a part corresponding to the back part 14, and when the opened chassis 12A and 12B are folded in half, the movable back plate moves from the open ends 12Aa and 12Ba to the back part 14 together with the movable hinges. In other words, this portable information device 10 includes the back part 14 that moves in accordance with the opening/closing motion of the chassis 12A and 12B.

Therefore, as shown in FIGS. 9A to 9D, when the chassis 12A and 12B are closed, the back part 14 moves in the direction away from the display 16, and so this can accommodate the movement of the display 16 at the folding part so as not to extend out. As a result, the display 16 can be folded smoothly, and the display 16 can have a folded shape in half without deformation inside of the closed chassis 12A and 12B (see FIG. 15), and therefore breakage or failure of the display can be avoided. The movable back part 14 can avoid the deterioration of quality of appearance of the device. This deterioration results from both ends of the display 16 extending out from the open ends 12Aa and 12Ba when the chassis 12A and 12B are opened and closed. Further, such a movable back part 14 of the portable information device 10 always supports the rear face of the display 16 irrespective of the opening/closing angle of the chassis 12A and 12B (see FIGS. 9A to 9D).

In the conventional device, the display 16 as a whole slides in the chassis 12A and 12B so as to accommodate a difference in perimeter between the display 16 and the chassis 12A and 12B during opening/closing. On the contrary, the display 16 of this portable information device 10 is fixed to the chassis 12A and 12B, and the back part 14 instead of the display 16 slides so as to accommodate a difference in perimeter during opening and closing. Therefore there is no need to keep a gap for sliding between the display 16 and the chassis 12A and 12B, and so entrance of foreign matters or water between the display 16 and the chassis 12A and 12B can be avoided when the display 16 is opened.

The sliding protrusions 40A and 40B sliding on the inclined faces 42A and 42B may be disposed at the movable hinges 18A and 18B instead of at the movable back plate 20, from which a similar advantageous effect can be obtained.

This portable information device 10 includes the first elastic member 26A and the second elastic member 26B. The first elastic member biases the first slide member 22A of the movable hinge 18A in the direction toward the open end 12Aa and the second elastic member biases the second slide member 22B of the movable hinge 18B in the direction toward the open end 12Ba. With this configuration, biasing force of the elastic members 26A and 26B always act on the movable hinges 18A and 18B and the movable back plate 20, and so rattle of the back part 14 can be avoided.

This portable information device 10 includes the shaft bar 35 as the rotary axis of the first back plate 34A and the second back plate 34B and the shaft pins 30 as the rotary axis of the first rotary members 28A and the second rotary members 28B, and the shaft bar and the shaft pins are disposed coaxially. With this configuration, the movable hinges 18A and 18B and the movable back plate 20 can move integrally and smoothly.

3. Configuration of Pushup Mechanism of Display

When the chassis 12A and 12B of this portable information device 10 are opened and closed, the display 16 moves up and down on the inner faces of the chassis 12A and 12B because of a difference in perimeter between the display 16 on the inside and the chassis 12A and 12B on the outside. The display 16 is soft, and so it is desirable that the display reliably move up on the inner faces of the chassis 12A and 12B to define one plane preferably, especially when the device is opened for use. To this end, this portable information device 10 may include a pushup mechanism 50 to push up the display 16 when the chassis 12A and 12B are opened (see FIG. 10).

3.1 Configuration of Pushup Mechanism

The following describes the configuration of the pushup mechanism 50. The following describes the pushup mechanism 50 of one of the chassis 12A as an example. Since the pushup mechanism 50 of the other chassis 12B has the same configuration other than that it has a line-symmetric configuration of the pushup mechanism 50 of the one chassis 12A with respect to the back part 14, its detailed descriptions are omitted.

Figure 10:
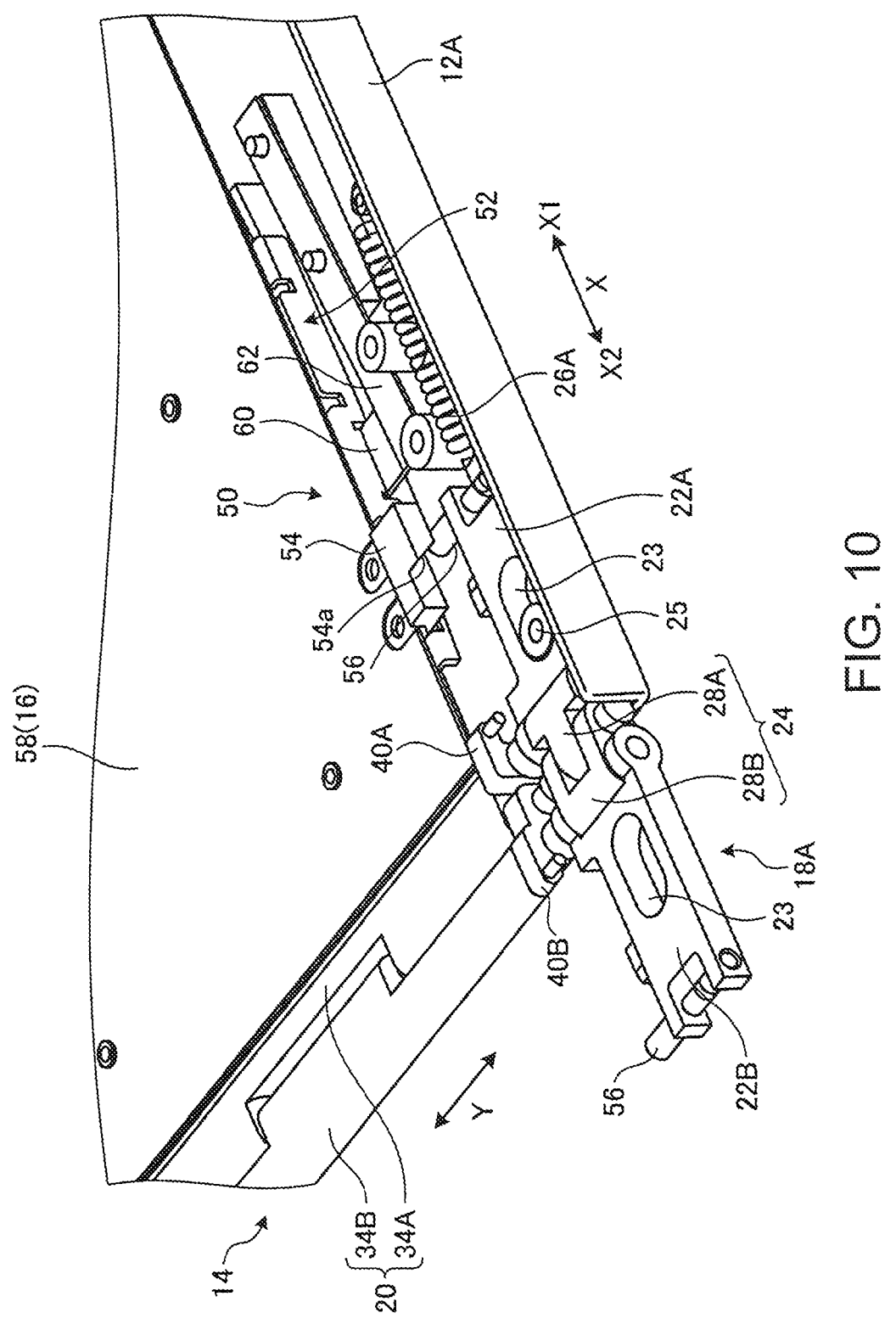
Figure 11A:
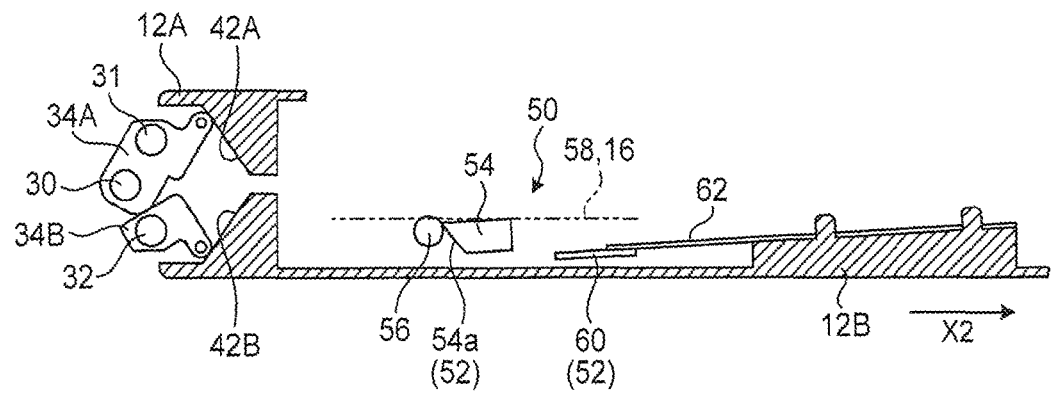
FIG. 11A is a cross-sectional view of a pushup mechanism when the chassis are closed to 0 degree.
Figure 11B:
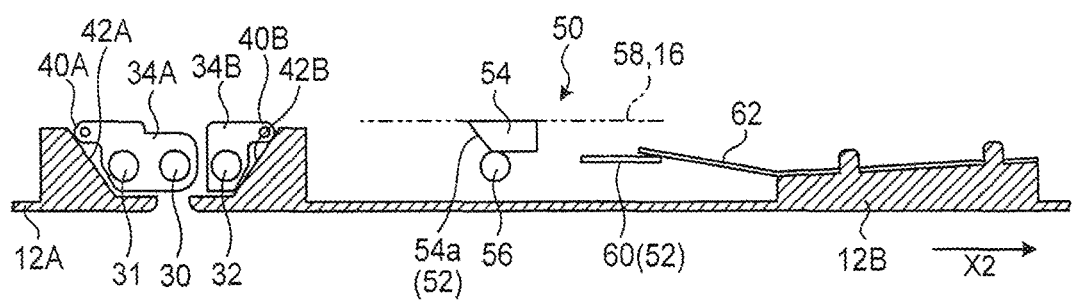
FIG. 11B is a cross-sectional view of the pushup mechanism when the chassis are opened at 180 degrees.

FIG. 10 is a perspective view of the pushup mechanism 50. This drawing is an enlarged view around the one movable hinge 18A. FIG. 11A is a cross-sectional view of the pushup mechanism 50 when the chassis 12A and 12B are closed to 0 degree. FIG. 11B is a cross-sectional view of the pushup mechanism 50 when the chassis 12A and 12B are opened at 180 degrees.

As shown in FIGS. 10, 11A and 11B, the pushup mechanism 50 includes an elevating base 52, a receiving, member 54 and a contacting part 56. The elevating base (base plate) 52 is a metal plate of a rectangular frame shape, for example. The elevating base 52 is disposed on the rear face of a flexible sheet 58 supporting the rear face of the display 16 at a position from a substantially center of the chassis 12A in the X direction to the back part 14. The elevating base 52 is supported on the inner face of one of the chassis 12A so that a part close to the back part 14 is swingable up and down while having a part close to the open end 12Aa as a swing axis. The flexible sheet 58 is a thin plate made of stainless steel, for example, which is a blade-spring type sheet having a certain degree of elasticity. At both lateral parts of the elevating, base 52 in the Y direction, the receiving member 54 and a protruding piece 60 are disposed in this order from the back part 14 toward the open end 12Aa.

On the outside of the elevating base 52 in the Y direction, a pushdown elastic member 62 is disposed, and this pushdown elastic member is attached on the inner face of the chassis 12A. The pushdown elastic member 62 is a band-plate like blade spring along the X direction. The pushdown elastic member 62 has a cantilevered structure having an end close to the back part 14 as a free end, and is attached to the inner face of the chassis 12A. The pushdown elastic member 62 always biases the protruding piece 60 so as to always bias the elevating base 52 in the pushing-down direction toward the inner face of the chassis 12A.

The receiving member 54 like a block is disposed so as to protrude from each of the Y-direction lateral parts of the elevating base 52. The receiving member 54 has a receiving face 54a that is an inclined face inclining so as to ascend from the inner face of the chassis 12A in the direction from the open end 12Aa to the back part 14.

The contacting part 56 is a circular cylindrical pin that protrudes inwardly from the end of the first slide member 22A close to the open end 12Aa. The contacting part 56 is disposed to be slidable on the receiving face 54a of the receiving member 54.

3.2 Motion and Action of Pushup Mechanism

When the chassis 12A and 12B are closed at 0 degree as shown in FIG. 2, the movable hinges 18A, 18B and the movable back plate 20 of the back part 14 are farthest from the open ends 12Aa and 12Ba. Therefore, in the movable hinge 18A, the first slide member 22A is farthest from the open end 12Aa, and in the movable hinge 18B, the second slide member 22B is farthest from the open end 12Ba. As shown in FIG. 11A, the contacting part 56 of the first slide member 22A (second slide member 22B) is located at the uppermost end of the receiving face 54a of the receiving member 54, and the elevating base 52 is located at a position pushed down by the biasing force of the pushdown elastic member 62. Therefore a part of the elevating base 52 close to the back part 14 descends and is pushed down on the inner face of the chassis 12A and the display 16 also is pushed down.

When the chassis 12A and 12B are opened from this state, the first slide member 22A of each of the movable hinges 18A and 18B slides to the open end 12Aa (X1 direction) due to the biasing force of the first elastic member 26A. The second slide member 22B of each of the movable hinges 18A and 18B slides to the open end 12Ba (X2 direction) due to the biasing force of the second elastic member 26B. As shown in FIG. 11B, during this opening motion, the contacting part 56 of the first slide member 22A (second slide member 22B) slides on the receiving face 54a of the receiving member 54, and gradually pushes up the receiving member 54 (display 16) against the biasing force of the pushdown elastic member 62.

When the chassis 12A and 12B are opened at 180 degrees as shown in FIG. 1, the first slide member 22A (second slide member 22B) slides to be closest to the open end 12Aa (12Ba). At this time as shown in FIG. 11B, the contacting part 56 passed through the receiving face 54a of the receiving member 54 is located on the lower face of the receiving member 54. Therefore the receiving member 54 is held at the highest position by the contacting part 56, and so the display 16 also is held at the highest pushed up position.

When the chassis 12A and 12B opened at 180 degrees are closed to 0 degree, the reversed motion occurs. That is, when the chassis 12A and 12B are closed, the contacting part 56 slides on the receiving face 54a, whereby the receiving member 54 gradually descends due to the biasing force of the pushdown elastic member 62, and the display 16 also is pushed down.

In this way, the portable information device 10 according to the present embodiment includes the pushup mechanism 50, and the pushup mechanism is configured to, when the pair of the chassis 12A and 12B are opened from the folded state in half, push up the display 16 in the ascending direction from the inner faces of the chassis 12A and 12B while being operatively associated with the motion of the back part 14. Therefore when the pair of the chassis 12A and 12B is opened, the part of the display 16 especially around the back part 14 can ascend on the inner faces of the chassis 12A and 12B. As a result, the display 16 can define one plane and can keep the plane, so that the viewability and operability of the display 16 are improved when the pair of the chassis 12A and 12B is opened for use.

The pushup mechanism 50 may be configured so that the receiving member 54 is disposed at the movable hinge 18A, 18B and the contacting part 56 is disposed at the elevating base 52. The pushup mechanism 50 may be operatively associated with the motion of the movable back plate 20 instead of the movable hinges 18A and 18B. The pushup mechanism may be operatively associated with at least one of the movable hinges 18A and 18B and the movable back plate 20.

Modified Example of Pushup Mechanism

The following describes a pushup mechanism 70 according to a modified example. The following describes the pushup mechanism 70 of the other chassis 12B as an example. Since the pushup mechanism 70 of the one chassis 12A has the same configuration other than that it has a line-symmetric configuration of the pushup mechanism 70 of the other chassis 12B with respect to the back part 14, its detailed descriptions are omitted.

Figure 12:
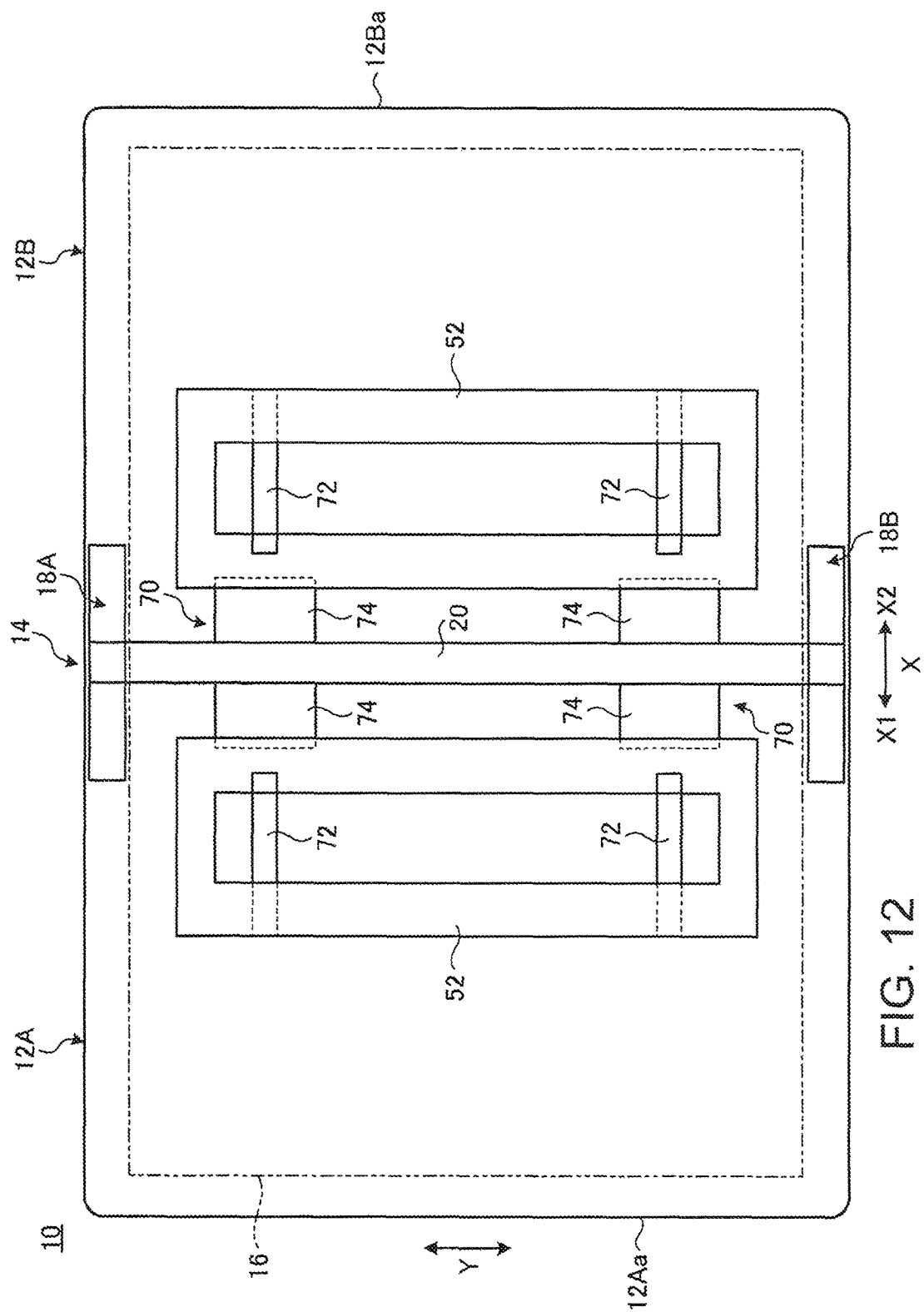
FIG. 12 is a plan view of a pushup mechanism according to a modified example.
Figure 13:
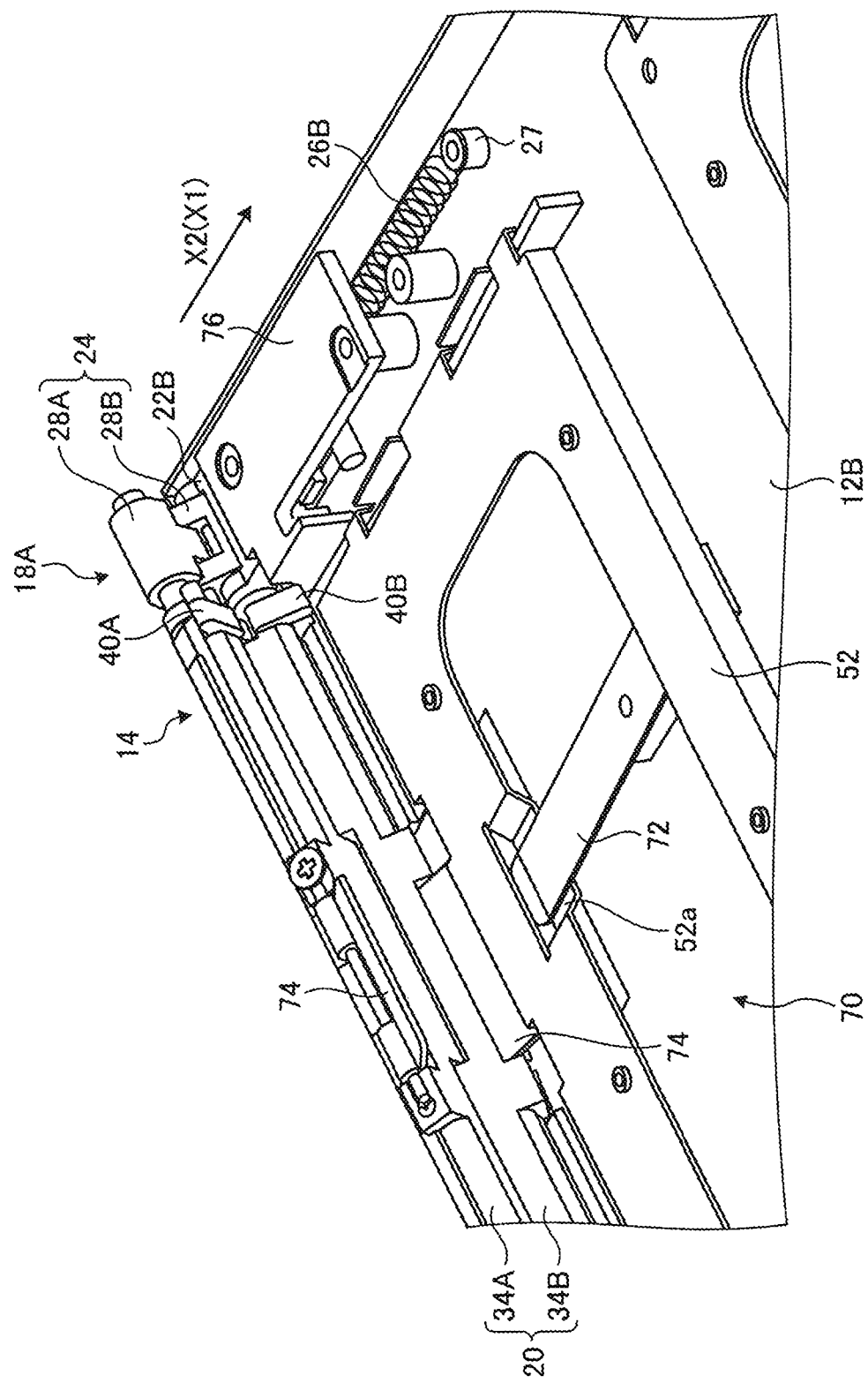
FIG. 13 is a perspective view of the pushup mechanism according to the modified example.
Figure 14A:
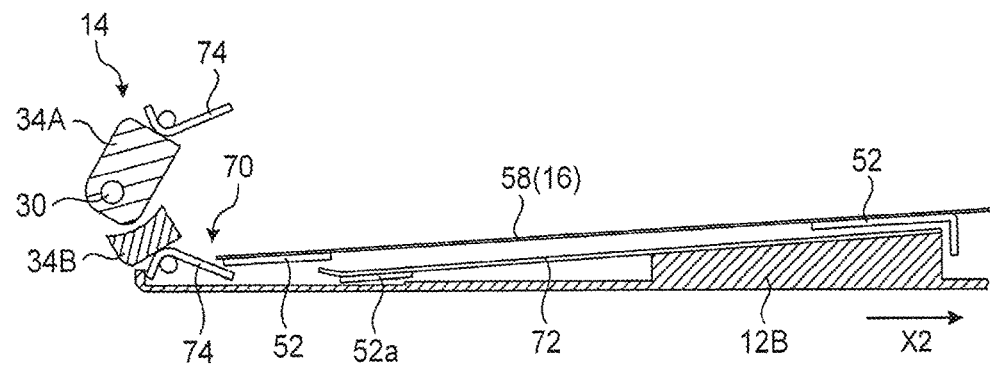
FIG. 14A is a cross-sectional view of the pushup mechanism from FIG. 12 when the chassis are closed to 0 degree.
Figure 14B:
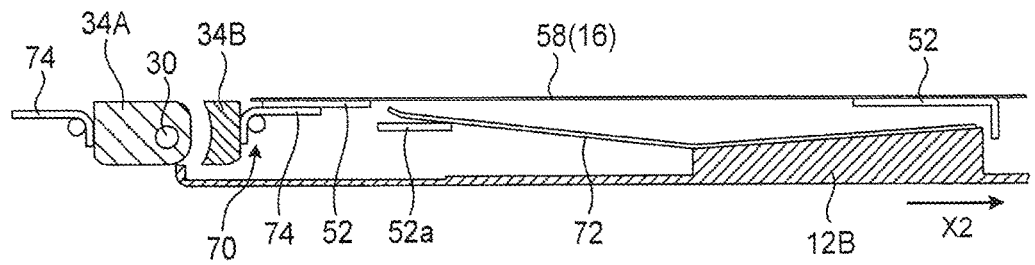
FIG. 14B is a cross-sectional view of the pushup mechanism from FIG. 14A when the chassis are opened at 180 degrees.

FIG. 12 is a plan view of the pushup mechanism 70 according to this modified example. FIG. 13 is a perspective view of the pushup mechanism 70 according to this modified example. This drawing is an enlarged view around the movable hinge 18A of the chassis 12B. FIG. 14A is a cross-sectional view of the pushup mechanism 70 of FIG. 12 when the chassis 12A and 12B are closed at 0 degree. FIG. 14B is a cross-sectional view of the pushup mechanism 70 of FIG. 14A when the chassis 12A and 12B are opened at 180 degrees.

As shown in FIGS. 12 to 14B, the pushup mechanism 70 includes an elevating base 52, a pushdown elastic member 72 and a pushup plate 74. Reference numeral 76 in FIG. 13 denotes a lid member to hold the upper face of the second slide member 22B, and this lid member is disposed at the first slide member 22A as well.

The elevating base 52 of the pushup mechanism 70 has a configuration similar to that of the elevating base 52 of the pushup mechanism 50. When the pushup mechanism 70 is disposed instead of the pushup mechanism 50, the receiving member 54 and the protruding piece 60 of the elevating base 52 may be omitted (see FIG. 13).

The pushdown elastic member 72 is a band-plate like blade spring along the X direction. The pushdown elastic member 72 has a cantilevered structure having an end close to the back part 14 as a free end, and is attached to the inner face of the chassis 12B. The pushdown elastic member 72 biases the upper face of a pushed part 52a of the elastic member 52 at a part close to the back part 14. Thereby the pushdown elastic member 72 always biases the elevating base 52 (display 16) in the pushing-down direction toward the inner face of the chassis 12B.

The pushup plate 74 is a plate-like member protruding from the outer face of the second back plate 34B toward the open end 12Ba (X2 direction), and the pushup plate can rotate and move integrally with the second back plate 34B. The leading end of the pushup plate 74 comes in contact with the lower face of the elevating base 52.

3.4 Motion and Action of Pushup Mechanism According to the Modified Example

When the chassis 12A and 12B are closed at 0 degree as shown in FIG. 2, the first back plate 34A and the second back plate 34B are at mutually flexed positions about the shaft bar 35 as the rotary center. At this time, as shown in FIG. 14A, the pushup plates 74 at the first back plate 34A and the second back plate 34B are at rotated positions so that their leading ends are closest to the inner faces of the chassis 12A and 12B. Therefore the pushing force of the pushup plate 74 does not act on the elevating base 52, and so the elevating base 52 is pushed down due to the biasing force of the pushdown elastic member 72. As a result, a part of the elevating base 52 close to the back part 14 descends and is pushed down on the inner face of the chassis 12A, and the display 16 also is pushed down.

When the chassis 12A and 12B are opened from this state, the first back plate 34A and the second back plate 34B rotate in the opening direction about the shaft bar 35 as the rotary center. Then, as shown in FIG. 14B, the pushup plate 74 pushes the elevating base 52, and gradually pushes up the display 16 against the biasing force of the pushdown elastic member 72.

When the chassis 12A and 12B are opened at 180 degrees as shown in FIG. 1, the first back plate 34A and the second back plate 34B are rotated about the shaft bar 35 as the rotary center and are disposed in a plane. At this time as shown in FIG. 14B, the pushup plate 74 holds the elevating base 52 at the highest position that is substantially parallel to the inner faces of the chassis 12A and 12B, and so the display 16 is at the highest pushed up position.

When the chassis 12A and 12B opened at 180 degrees are closed to 0 degree, the reversed motion occurs. That is, when the chassis 12A and 12B are closed, the pushup plate 74 rotates in the direction away from the elevating base 52. As a result, the elevating base 52 gradually descends due to the biasing force of the pushdown elastic member 72, and the display 16 also is pushed down.

The pushup mechanism 70 may be disposed together with the pushup mechanism 50 shown in FIGS. 10 to 11B. The pushup mechanism 70 is configured to rotate the pushup plate 74 with the rotating motion of the first back plate 34A and the second back plate 34B of the movable back plate 20 so as to push up the display 16. Therefore when the pushup mechanism 70 only is provided, the back part 14 that is movable in the X direction is not always required as long as the device includes the two rotating back plates 34A and 34B and the two rotating rotary members 28A and 28B. The pushup plate 74 may be disposed at each of the rotary members 28A and 28B instead of at each of the back plates 34A and 34B.

The pushup mechanism 50, 70 may be used singly without the movable back part 14 including the movable hinges 18A and 18B and the movable back plate 20. That is, the configuration including the pushup mechanism 50, 70 may be used in a portable information device 10 configured so that both ends of the display 16 are not fixed to the open ends 12Aa and 12Ba, and a difference in perimeter between the display 16 and the chassis 12A and 12B during opening/closing is accommodated by sliding the both ends of the display at the open ends 12Aa and 12Ba.

4. Supporting Base of Display

This portable information device 10 is configured so that the soft display 16 moves up and down on the inner faces of the chassis 12A and 12B while being operatively associated with the opening and closing motion of the chassis 12A and 12B. Therefore a space for ascending and descending of the display 16 is required on the inner faces of the chassis 12A and 12B, and so the space for electronic parts, such as a battery and an arithmetic device, is limited. This portable information device 10 then may include a supporting base 80 to minimize the space for ascending and descending space of the display 16 (see FIG. 15).

4.1 Configuration of Supporting Base

Figure 15:
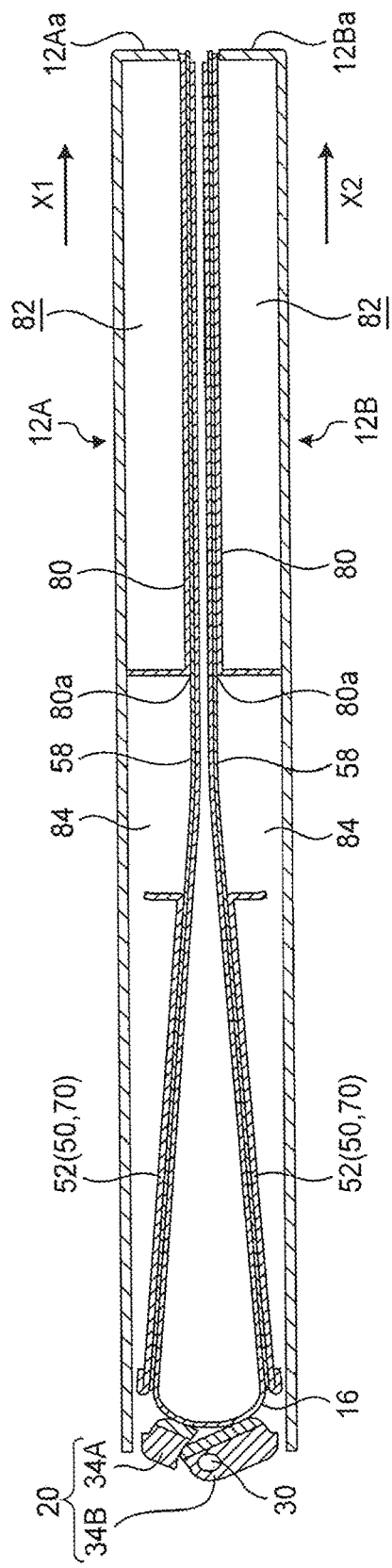
FIG. 15 is a cross-sectional view of a supporting base when the chassis are closed to 0 degree.

FIG. 15 is a cross-sectional view of the supporting base 80 when the chassis 12A and 12B are closed at 0 degree. As shown in FIG. 15, the supporting base 80 is made of a thin metal plate that is bent into a L-letter shape. The supporting base 80 has one end fixed to the inner end of the open end 12Aa, 12Ba of the chassis 12A, 12B, and the other end fixed to the inner face of the chassis 12A, 12B at a position (substantially center) between the open end 12Aa, 12Ba and the back part 14.

The supporting base 80 is a base, and the upper face of the supporting base supports the rear face of the display 16 at a substantially half part of the display close to the open ends 12Aa, 12Ba. The supporting base 80 supports the rear face of the display 16 between the back part 14 and the open ends 12Aa and 12Ba and at a position upwardly away from the inner faces of the chassis 12A and 12B. That is, when the chassis 12A and 12B are opened at 180 degrees, the display 16 defines a plane on the upper faces of the supporting bases 80 of the left and right chassis 12A and 12B. When the chassis 12A and 12B are closed to 0 degree, the display 16 is slightly deformed to be bent toward the inner faces of the chassis 12A and 12B at ends 80a of the supporting bases 80 close to the back part 14 of the left and right chassis 12A and 12B as the supporting points.

In this way, the supporting bases 80 hold a part of the display 16 close to the open ends 12Aa and 12Ba (substantially half) at the same position between the two-folded position and the position opened from the folded state. This can define a space 82 between the supporting bases 80 and the chassis 12A and 12B, and this space can be kept irrespective of the ascending and descending of the display 16 during the opening and closing motion of the chassis 12A and 12B. Therefore this space 82 can be used for disposing electronic parts, such as a battery and an arithmetic device. In this way, an electronic part of a certain thickness also can be stored in the space 82, and this does not interfere with thinner chassis 12A and 12B.

As shown in FIG. 15, there is a gap 84 between the elevating bases 52 of the pushup mechanism 50 (70) and the supporting bases 80 so as to enable the ascending and descending motion of the elevating base 52 and deformation of the display 16. This portable information device 10 includes a flexible sheet (sheet-like member) 58 between the upper face of the elevating base 52 and the upper face of the supporting base 80, and this flexible sheet 58 covers the gap 84. This can avoid unexpected deformation and bending of the display 16 at the gap 84.

This portable information device 10 includes the pushup mechanism 50 (70) at a part between the back part 14 of the chassis 12A, 12B and the supporting base 80. When the supporting base 80 holds a part of the display 16 closer to the open ends 12Aa and 12Ba above the inner faces of the chassis 12A and 12B, such a pushup mechanism 50 (70) can push up the display 16 at a part closer to the back part 14 from the supporting base 80 reliably. Therefore, when the chassis 12A and 12B are opened at 180 degrees, the display 16 can define a plane more reliably across its overall width.

The supporting base 80 may be used singly without the movable back part 14 including the movable hinges 18A and 18B and the movable back plate 20 or the pushup mechanism 50 (70). That is, the configuration including the supporting base 80 may be used in a portable information device 10 configured so that both ends of the display 16 are not fixed to the open ends 12Aa and 12Ba, and a difference in perimeter between the display 16 and the chassis 12A and 12B during opening/closing is accommodated by sliding the both ends of the display at the open ends 12Aa and 12Ba.

As has been described, the present invention provides a portable information device having a display that can be folded inside of a foldable chassis.

While the invention has been particularly shown and described with reference to a preferred embodiment, it will be understood by those skilled in the art that various changes in form and detail may be made therein without departing from the spirit and scope of the invention.

What is claimed is:

1. A portable information device comprising:
   a first chassis and a second chassis;
   a display disposed over inner faces of said first and second chassis, wherein said display to be foldable in half;
   a back part includes a movable hinge for joining said first and second chassis rotatably; wherein when said first and second chassis are folded towards each other, said movable hinge moves on said inner faces of said chassis in a direction from open ends of said chassis to said back part that is located on an opposite side of said open ends, wherein said movable hinge includes
      a first slide member supported slidably on said inner face of one of said chassis;
      a second slide member supported slidably on said inner face of another one of said chassis; and
      a hinge shaft configured to join said first slide member and said second slide member rotatably; and
   a movable back plate for supporting a rear face of said display at a part corresponding to said back part, wherein when said first and second chassis are folded towards each other, said movable back plate moves in a direction from said open ends to said back part together with said movable hinge.

2. The portable information device of claim 1, wherein said movable back plate includes
   a first back plate joined rotatably with said first slide member; and
   a second back plate joined rotatably with said first back plate and joined rotatably with said second slide member.

3. The portable information device of claim 2, wherein when said first and second chassis are folded towards each other, said first and second slide members slide while rotating about said hinge shaft as a rotary center, so that said first and second back plates move in the direction from said open ends to said back part while mutually rotating.

4. The portable information device of claim 1, wherein
   said inner face of said one chassis includes a first inclined face inclining from a center between said first and second chassis to the outside in the direction from said open ends to said back part when said first and second chassis are folded towards each other; and
   said inner face of said another chassis includes a second inclined face inclining from the center between said first and second chassis to the outside in the direction from said open ends to said back part when said first and second chassis are folded towards each other.

5. The portable information device of claim 4, wherein when said first and second chassis are folded towards each other, said first and second back plate mutually rotate while sliding on said first and second inclined faces, respectively, so that said movable back plate moves in the direction from said open ends to said back part together with said movable hinge.

6. The portable information device of claim 1, further comprising:
   a first elastic member configured to bias said first slide member in the direction from said back part to said open end of said one chassis; and
   a second elastic member configured to bias said second slide member in the direction from said back part to said open end of said other chassis.

7. The portable information device of claim 1, wherein said hinge shaft includes
   a first rotary member joined rotatably with said first slide member; and
   a second rotary member joined rotatably with said first rotary member and joined rotatably with said second slide member, wherein said first back plate is joined rotatably with said first rotary member, said second back plate is joined rotatably with said second rotary member, and a rotary axis of said first back plate and said second back plate and a rotary axis of said first rotary member and said second rotary member are disposed coaxially.

8. The portable information device of claim 1, wherein a pair of the movable hinges is disposed at both ends of said back part.

9. The portable information device of claim 8, wherein said movable back plate extends between said pair of movable hinges.

10. The portable information device of claim 1, wherein said first chassis at a part closer to said open end is fixed in position to one end of said display, and said second chassis at a part closer to said open end is fixed in position to another end of said display.

11. The portable information device of claim 1, wherein said movable back plate has a through hole, through which Wiring connecting said first and second chassis extends.

12. The portable information device of claim 1, further comprising a pushup mechanism configured to, when said first and second chassis folded towards each other is opened, push up said display in an ascending direction from said inner faces of said chassis while being operatively associated with a motion of at least one of said movable hinge and said movable back plate.

13. The portable information device of claim 12, further comprising a pushdown elastic member configured to push down said display in a descending direction towards said inner faces of said chassis.

14. The portable information device of claim 1, further comprising a pushup mechanism configured to, when said first and second chassis folded in half is opened, push up said display in an ascending direction from said inner faces of said chassis while being operatively associated with a motion of said movable hinge.

15. The portable information device of claim 14, wherein said pushup mechanism includes
  a contacting part disposed at least one of said first and second slide members; and
  a receiving member configured to be slidable with said contacting part, said receiving member being fixed to said display, at least one of said contacting part and said receiving member having an inclined face to let said receiving member ascend when said contacting part slides on said receiving member.

16. The portable information device of claim 15, wherein said pushup mechanism includes a pushup plate disposed at least one of said first and second back plates, said pushup plate being configured to rotate with the rotation of said first back plate and said second back plate so as to push up said display.

* * * * *